(12) United States Patent
Fukuda

(10) Patent No.: US 7,868,542 B2
(45) Date of Patent: Jan. 11, 2011

(54) LIGHT-EMITTING APPARATUS HAVING PERIODIC STRUCTURE AND SANDWICHED OPTICAL WAVEGUIDE

(75) Inventor: Koichi Fukuda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 299 days.

(21) Appl. No.: 12/028,107

(22) Filed: Feb. 8, 2008

(65) Prior Publication Data

US 2008/0303419 A1  Dec. 11, 2008

(30) Foreign Application Priority Data

| Feb. 9, 2007 | (JP) | 2007-030476 |
| Jul. 19, 2007 | (JP) | 2007-187796 |
| Jan. 22, 2008 | (JP) | 2008-011088 |

(51) Int. Cl.
 H05B 33/02 (2006.01)
 H05B 33/00 (2006.01)
 H01L 33/00 (2010.01)

(52) U.S. Cl. .......... 313/506; 313/507; 313/508; 313/509; 257/40; 257/98

(58) Field of Classification Search .......... 313/501–512
 See application file for complete search history.

(56) References Cited

U.S. PATENT DOCUMENTS

| 5,779,924 A |  | 7/1998 | Krames et al. ............... 216/24 |
| 6,252,895 B1 | * | 6/2001 | Nitta et al. ................. 372/50.1 |
| 6,396,208 B1 |  | 5/2002 | Oda et al. ................... 313/504 |
| 6,630,684 B2 | * | 10/2003 | Lee et al. ...................... 257/40 |
| 2005/0077820 A1 |  | 4/2005 | Onishi et al. ................. 313/506 |
| 2005/0145861 A1 | * | 7/2005 | Kawakami et al. ............ 257/88 |
| 2005/0194896 A1 | * | 9/2005 | Sugita et al. ................. 313/506 |
| 2007/0069641 A1 |  | 3/2007 | Hasegawa et al. ............ 313/504 |
| 2007/0126353 A1 | * | 6/2007 | Kubota et al. ................ 313/506 |
| 2007/0257609 A1 |  | 11/2007 | Fukuda et al. ............... 313/506 |
| 2008/0067926 A1 |  | 3/2008 | Mizuno et al. ............... 313/504 |

FOREIGN PATENT DOCUMENTS

| JP | 11-214163 | 8/1999 |
| JP | 2004-349111 | 12/2004 |

OTHER PUBLICATIONS

Tang et al., "Organic Electroluminescent diodes," *Appl. Phys. Lett.*, vol. 51, No. 12, 913-915 (1987).

* cited by examiner

*Primary Examiner*—Sikha Roy
*Assistant Examiner*—Tracie Green
(74) *Attorney, Agent, or Firm*—Fitzpatrick, Cella, Harper & Scinto

(57) ABSTRACT

Provided is a light-emitting apparatus which can improve the light extraction efficiency without adversely influencing a functional layer of a light-emitting device and which includes a substrate; a light-emitting device formed on the substrate, the light-emitting device including: a first electrode formed on the substrate; an insulating member covering a periphery of the first electrode; and a functional layer formed on an exposed portion of the first electrode and including an emission layer; and a second electrode formed on the functional layer and the insulating member, in which a periodic structure is formed on a surface of the insulating member opposite to a substrate side, and an optical waveguide is formed between a bottom portion of the periodic structure and the first electrode or between the bottom portion of the periodic structure and the substrate.

13 Claims, 11 Drawing Sheets

LIGHT-EMITTING APPARATUS HAVING PERIODIC STRUCTURE AND SANDWICHED OPTICAL WAVEGUIDE

BACKGROUND OF THE INVENTION

1. Field of the Invention

The present invention relates to a light-emitting apparatus.

2. Description of the Related Art

An organic electroluminescent (EL) display, being a kind of light-emitting apparatus, is a new type of flat panel display and formed from an array of organic light-emitting diode (OLED) devices. In general, an OLED device is comprised of an electrode serving as the anode, an electrode serving as the cathode and several thin organic layers sandwiched between these two electrodes. The organic layers include at least one emission layer containing more than one fluorescent or phosphorescent organic compounds to emit light of each emission color. When applying a voltage to the OLED device, holes and electrons are injected from the anode and the cathode, respectively, and form excitons in the emission layer. Then these excitons recombine and release their energy as emission of light. According to a research conducted by Eastman Kodak Company in 1987, which is reported in Appl. Phys. Lett. 51, 913 (1987), a device with a two-layered structure is proposed, and light emission of about 1,000 cd/m$^2$ at an applied voltage of about 10 V is reported. ITO is used for an anode, an Ag—Mg alloy is used for a cathode, an aluminum quinolinol complex is used as an electron-transporting and emission layer, and a triphenyl amine derivative is used for a hole-transporting layer.

As one of problems involved in the development of an organic light-emitting apparatus, there is a need for reduction in power consumption. The OLED device generally has a structure in which functional layers including an emission layer are stacked one-dimensionally. In this case, the refractive index (about 1.7 or more) of the emission layer is larger than that of the air. Therefore, most of light emitted from an inside of the emission layer becomes guided-wave light and is reflected totally. Therefore, most of light emitted from an inside of the emission layer is trapped in guided-wave light in the device by total reflection at an interface of the stacked film at which the refractive index changes from high to low. The percentage (light extraction efficiency) of light that can be extracted and utilized of the light generated inside the emission layer is generally merely about 20%.

Thus, in order to reduce the power consumption of the organic light-emitting apparatus, it is important to enhance the light extraction efficiency to improve the emission efficiency of the OLED device. It has been proposed in U.S. Pat. No. 5,779,924 and Japanese Patent Application Laid-Open No. 2004-349111 that in order to prevent total reflection and suppress the light confinement inside the device, periodic structures (a subwavelength periodic structure, a diffraction grating, etc.) is placed in upper and lower portions (on a light extraction side and on an opposite side thereof) of the functional layer.

As another method, in Japanese Patent Application Laid-Open No. H11-214163, there has been proposed that in order to reflect, in a light extraction direction, the light which is confined in a device as a guided-wave light and leaks out through a side surface of the device, an inclined metallic reflective surface is disposed at a device side surface to improve the light extraction efficiency.

According to the technologies disclosed in U.S. Pat. No. 5,779,924 and Japanese Patent Application Laid-Open No. 2004-349111 above, in the case of disposing a periodic structure at an upper portion of a functional layer, it is necessary to make the periodic structure after formation of the functional layer, so that there is a problem that the functional layer may be damaged during the making process of the periodic structure.

Further, in the case of disposing a periodic structure at a lower portion of a functional layer, because the interface between the functional layer and an electrode, or the like is not flat, there is a problem that non-uniformity and reduction in adhesiveness of a film and the like occur during formation of the film by vacuum vapor deposition, which may degrade the device characteristics and the device durability.

According to the technology disclosed in Patent Application Laid-Open No. H11-214163 above, because the distance between electrodes varies between when measured at a center portion and when measured at a peripheral portion of the device due to the inclination of the metal electrode. Therefore, there is a problem of degradation of the device durability caused by local light emission and increase of the number of non-light-emitting devices due to short-circuiting between the electrodes.

SUMMARY OF THE INVENTION

In view of the above-mentioned problems, an object of the present invention is to provide a light-emitting apparatus which can improve light extraction efficiency without adversely influencing a functional layer of a light-emitting device.

As a measure for solving the above-mentioned problems, a light-emitting apparatus according to a first aspect of the present invention includes: a substrate; a light-emitting device formed on the substrate, the light-emitting device including: a first electrode formed on the substrate; an insulating member covering a periphery of the first electrode; and a functional layer formed on an exposed portion of the first electrode and including an emission layer; and a second electrode formed on the functional layer and the insulating member, in which a periodic structure is formed on a surface of the insulating member opposite to a substrate side, and an optical waveguide is formed between a bottom portion of the periodic structure and the first electrode or between the bottom portion of the periodic structure and the substrate.

According to the present invention, the light extraction efficiency can be improved without adversely influencing the functional layer of the light-emitting device.

Further features of the present invention will become apparent from the following description of exemplary embodiments with reference to the attached drawings.

DESCRIPTION OF THE EMBODIMENTS

Hereinafter, the principle of the present invention will be described based on one exemplary structure.

Figure 1:
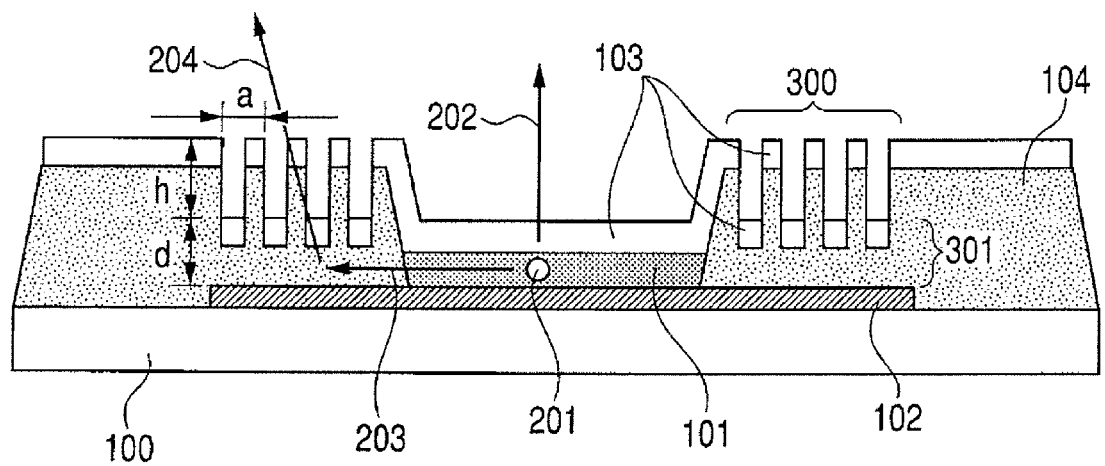
FIG. 1 is a schematic cross-sectional view illustrating an organic light-emitting apparatus having a periodic structure.

FIG. 1 is a schematic cross-sectional view illustrating an organic light-emitting apparatus having a periodic structure. In the illustrated figure, an organic light-emitting apparatus is illustrated, but the present invention can be carried out even with an inorganic light-emitting apparatus or a quantum dot light-emitting diode (QD-LED) apparatus.

In an OLED device (light-emitting device) constituting the organic light-emitting apparatus illustrated in FIG. 1, a reflective electrode (first electrode) 102 as an anode is formed on a substrate 100. A device separation layer 104 made of an insulating member is formed so as to cover the periphery of the reflective electrode 102. A functional layer (organic layer) 101 containing more than one fluorescent organic compounds or phosphorescent organic compounds, and a transparent electrode (second electrode) 103 as a cathode are formed on a portion of the reflective electrode 102 exposed through an opening of the device separation layer 104.

Figure 3:
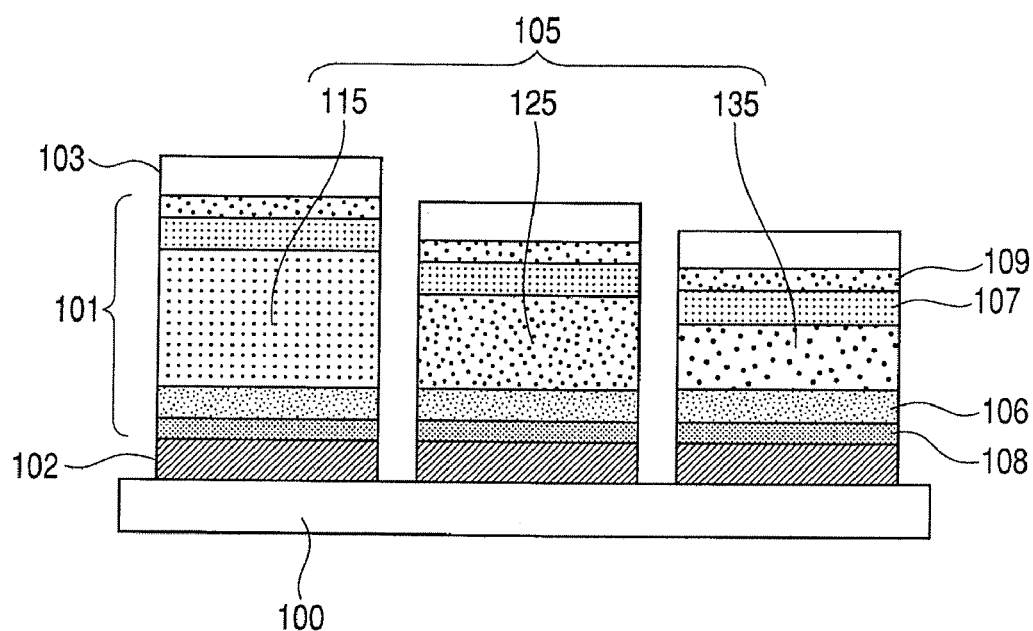
FIG. 3 is a schematic cross-sectional view illustrating an organic layer.

As illustrated in FIG. 3, the organic layer 101 generally has a structure in which a hole-transporting layer 106, an emission layer 105 (R emission layer 115, G emission layer 125, B emission layer 135), and an electron-transporting layer 107 are stacked. Further, as needed, a hole injection layer 108 may be interposed between the reflective electrode 102 and the hole-transporting layer 106, and an electron injection layer 109 may be interposed between the transparent electrode 103 and the electron-transporting layer 107.

The emission layer 105 contains a fluorescent organic compound or a phosphorescent organic compound depending on each emission color. A voltage is applied to the OLED device, whereby holes injected from the reflective electrode 102 and electrons injected from the transparent electrode 103 are recombined in the organic layer 101 to emit light. Incidentally, in the OLED device of this embodiment, the transparent electrode 103 side with respect to an emission point 201 serves as a light extraction surface.

Figure 4:
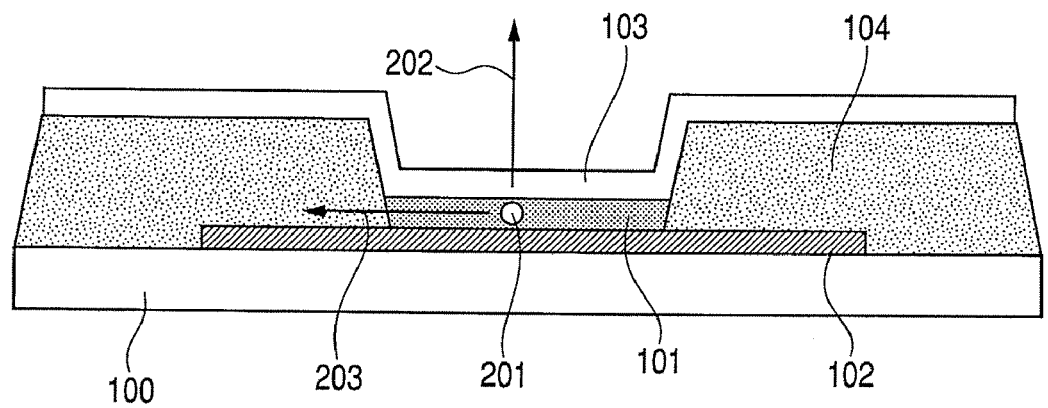
FIG. 4 is a schematic cross-sectional view illustrating an organic light-emitting apparatus having no periodic structure.

That is, the above organic light-emitting apparatus has substantially the same structure as that of a conventional organic light-emitting apparatus. However, in the conventional organic light-emitting apparatus, as illustrated in FIG. 4, in the visible range, the refractive index of an organic layer 101 including an emission layer is large (i.e., about 1.6 to 2.0), compared with the refractive index (1.0) of the air on the light extraction side. Therefore, the light which is incident on an air interface from the organic layer 101 side at an angle equal to or greater than a critical angle will be totally reflected. About 80% of light emitted from an emission point 201 is totally reflected and confined in the device as a guided-wave light 203. The percentage (light extraction efficiency) of light extracted out of the device as propagating light 202 is generally only about 20%.

Figure 2:
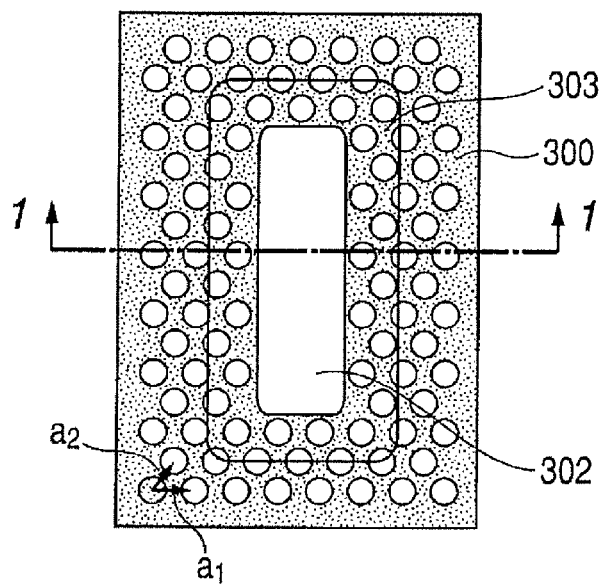
FIG. 2 is a schematic plan view illustrating the organic light-emitting apparatus having a periodic structure.
Figure 16:
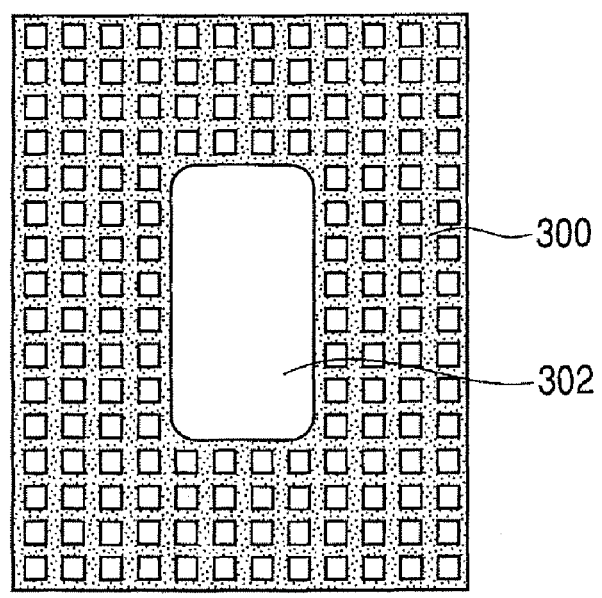
FIG. 16 is a schematic plan view illustrating an organic light-emitting apparatus having a periodic structure.
Figure 17:
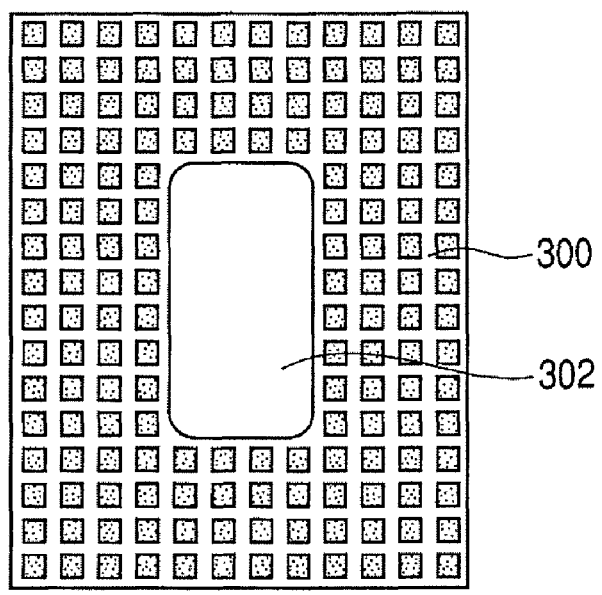
FIG. 17 is a schematic plan view illustrating an organic light-emitting apparatus having a periodic structure.

Therefore, in the organic light-emitting apparatus of the present invention, a periodic structure 300 is formed on a surface side of the device separation layer 104 opposite to the substrate 100 side. The periodic structure 300 of this embodiment has a two-dimensional photonic crystal structure at the periphery of an emission region 302, as illustrated in FIGS. 2, 16, and 17. The emission region 302 of FIGS. 2 and 17 correspond to a portion in which the reflective electrode 102, the organic layer 101, and the transparent electrode 103 are stacked as shown in FIG. 1.

Further, an optical waveguide 301 is formed between a bottom portion of the periodic structure 300 and the reflective electrode 102. That is, in order to form the optical waveguide 301, the reflective electrode 102 is formed so as to extend over a region where the periodic structure 300 is formed, as well as the emission region 302. The optical waveguide 301 is of a planar type, and is formed by adjusting the etch depth of the periodic structure 300.

In the organic light-emitting apparatus having the above structure, the guided-wave light 203 confined in the organic layer 101 is transmitted in a direction parallel to the surface of the substrate 101, and proceeds through the optical waveguide 301. While the guided-wave light 203 proceeds through the optical waveguide 301, the diffraction of the light is caused by the periodic structure 300, whereby the propagation direction of guided-wave light 203 is changed to a direction toward the light extraction surface. Consequently, the guided-wave light 203 is converted into diffracted light 204, whereby the light extraction efficiency is increased, and the emission efficiency is improved.

Further, as shown in FIG. 1, it is not necessary to form a periodic structure at upper and lower portions of the organic layer 101. This can prevent the above described degradation of the device characteristics and the device durability caused by damage of an organic layer when a periodic structure is subsequently formed on the organic layer formed, and the non-uniformity and reduction in adhesiveness of a film when an organic layer is formed above a periodic structure.

Further, as shown in FIG. 2, the region contributing to light emission is enlarged from only the emission region 302 to a region including the emission region 302 and a diffracted light region 303 existing at the periphery thereof. The diffracted light region 303 exists at a width of about 10 µm at the peripheral portion of the emission region 302, which will be described later in detail. Therefore, as the emission region 302 is decreased in size due to the tendency of increase in display resolution, the influence of the diffracted light 204 in the vicinity of the outer periphery increases, whereby the emission efficiency is further improved. Thus, even if the aperture ratio is decreased along with the increase in display resolution, the driving current density can be prevented from increasing, so that the durability of the OLED device can be maintained.

Hereinafter, the periodic structure 300 will be considered. As shown in FIG. 2, two primitive vectors defining the period of the periodic structure 300 are represented by $a_1$ and $a_2$. Further, primitive reciprocal lattice vectors which satisfy the relationship of Equation 1 with respect to the primitive vectors $a_1$ and $a_2$ are represented by $b_1$ and $b_2$. The peak wavelength of light emitted from the organic layer 101 of the OLED device (i.e., peak wavelength of a spectrum of light extracted to outside through the periodic structure 300) is represented by λ, and the wave number is represented by k=2π/λ. Further, the refractive index of the device separation layer 104 is represented by n, the refractive index of the light extraction side medium (generally, air) is denoted as $n_{ex}$, and it is assumed that a condition of n>$n_{ex}$ is satisfied.

$$a_i \cdot b_j = 2\pi \delta_{ij}, (i, j=1, 2) \quad \text{(Equation 1)}$$

The propagation coefficient in the direction parallel to the substrate 100 with respect to the guided-wave light 203 propagating through the optical waveguide 301 is represented by β, and an effective refractive index $n_{eff}$ and an effective absorption coefficient $k_{eff}$ with respect to the guided-wave light 203 are defined by Equation 2. The effective refractive index $n_{eff}$ satisfies a condition of $n_{ex}$<$n_{eff}$<n.

$$\beta = (n_{eff} + i\kappa_{eff})k \quad \text{(Equation 2)}$$

At this time, the diffraction condition is given by Equation 3 from a phase matching condition in a horizontal direction under the condition of $n_{ex}$<$n_{eff}$<n with two integers $m_1$, $m_2$ being diffraction orders and a diffraction angle with respect to a substrate normal direction being θ ($m_1$, $m_2$).

$$n_{eff} - n_{ex}\sin\theta = \frac{\lambda}{2\pi}|m_1 b_1 + m_2 b_2| \quad \text{(Equation 3)}$$

According to Equation 3, the condition for causing respective ($m_1$, $m_2$) order diffractions is within a range in which Equation 4 is satisfied. Further, if the condition of $n_{ex}$<$n_{eff}$<n is used, the condition for causing respective ($m_1$, $m_2$) order diffractions is substantially represented by Equation 5.

$$n_{eff} - n_{ex} < \frac{\lambda}{2\pi}|m_1 b_1 + m_2 b_2| < n_{eff} + n_{ex} \quad \text{(Equation 4)}$$

$$\frac{\lambda}{2\pi}|m_1 b_1 + m_2 b_2| < n + n_{ex} \quad \text{(Equation 5)}$$

The case where the periodic structure 300 is a tetragonal lattice such as illustrated in FIGS. 16 and 17 will be considered. FIG. 16 illustrates the case where recessed portions are squares, and FIG. 17 illustrates the case where protruding portions are squares. Assuming that the period of the tetragonal lattice is a, the primitive vectors $a_1$ and $a_2$ are represented by Equation 6, and the primitive reciprocal lattice vectors $b_1$ and $b_2$ are represented by Equation 7.

$$a_1 = \begin{pmatrix} a \\ 0 \end{pmatrix}, \quad \text{(Equation 6)}$$
$$a_2 = \begin{pmatrix} 0 \\ a \end{pmatrix}$$

$$b_1 = \frac{2\pi}{a}\begin{pmatrix} 1 \\ 0 \end{pmatrix}, b_2 = \frac{2\pi}{a}\begin{pmatrix} 0 \\ 1 \end{pmatrix} \quad \text{(Equation 7)}$$

At this time, the diffraction condition of Equation 3 is represented by Equation 8. Further, the condition for causing respective ($m_1$, $m_2$) order diffractions represented by Equation 4 is represented by Equation 9. Further, if the condition of $n_{ex}$<$n_{eff}$<n is used, the condition for causing respective ($m_1$, $m_2$) order diffractions is substantially represented by Equation 10.

$$n_{eff} - n_{ex}\sin\theta = \frac{\lambda}{a}\sqrt{m_1^2 + m_2^2} \quad \text{(Equation 8)}$$

$$\frac{\sqrt{m_1^2 + m_2^2}}{n_{eff} + n_{ex}}\lambda < a < \frac{\sqrt{m_1^2 + m_2^2}}{n_{eff} - n_{ex}}\lambda \quad \text{(Equation 9)}$$

$$\frac{\sqrt{m_1^2 + m_2^2}}{n_{eff} + n_{ex}}\lambda < a \quad \text{(Equation 10)}$$

Here, either one of one-dimensional directions is paid attention to, and it is presumed that when $m_2$=0 (or $m_1$=0) is assumed, then $m_1$=|$m_1$|=m>0 (or $m_2$=|$m_2$|=m>0) is attained. At this time, the diffraction condition of Equation 8 is simplified to be represented by Equation 11. Further, a period a for causing respective m-order diffractions is within a range in which Equation 12 is satisfied. Moreover, if the condition of $n_{ex}$<$n_{eff}$<n is used, the condition of the period a for causing respective m-order diffractions is substantially represented by Equation 13.

$$n_{eff} - n_{ex}\sin\theta = m\frac{\lambda}{a} \quad \text{(Equation 11)}$$

$$\frac{m}{n_{eff} + n_{ex}}\lambda < a < \frac{m}{n_{eff} - n_{ex}}\lambda \quad \text{(Equation 12)}$$

$$\frac{m}{n + n_{ex}}\lambda < a \quad \text{(Equation 13)}$$

Similarly, according to Equation 13, the period a for causing only the m-order diffraction is within the range in which Equation 14 is satisfied. Further, if the condition of $n_{ex} < n_{eff} < n$ is used, the condition of the period a for causing only the m-order diffraction is substantially represented by Equation 15.

$$\frac{m}{n_{eff}+n_{ex}}\lambda < a < \frac{m+1}{n_{eff}+n_{ex}}\lambda \quad \text{(Equation 14)}$$

$$\frac{m}{n+n_{ex}}\lambda < a < \frac{m+1}{2n_{ex}}\lambda \quad \text{(Equation 15)}$$

In the OLED device, generally, the refractive index n of the device separation layer 104 is about 1.5 to 2.5, and the refractive index $n_{ex}$ on the light extraction side is about 1.0 to 1.5. Thus, because the diffracted light 204 is generated according to Equation 13, it is desirable that the period a of the periodic structure 300 be substantially larger than 0.25 times the emission peak wavelength λ. Further, in the case of mainly utilizing low-order diffracted light such as first-order to third-order diffracted light, it is desirable according to Equation 15 that the period a of the periodic structure 300 be greater than 0.25 times the emission peak wavelength λ and smaller than 2.0 times the emission peak wavelength λ. Since the wavelength region of visible light is 380 nm to 780 nm, it is desirable that the period a of the periodic structure 300 be within a range of 120 nm to 1200 nm.

Figure 5:
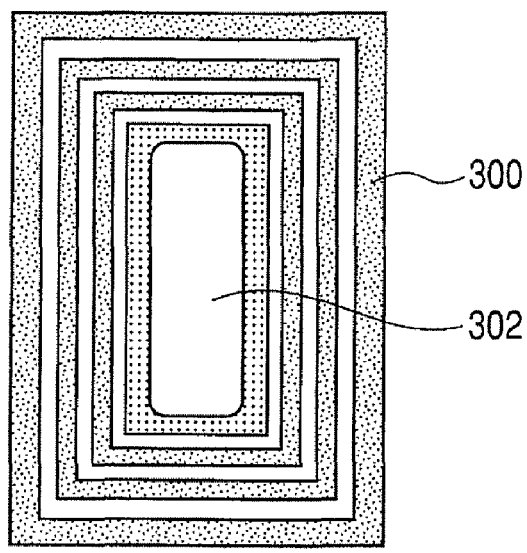
FIG. 5 is a schematic plan view illustrating an organic light-emitting apparatus having a periodic structure.
Figure 6:
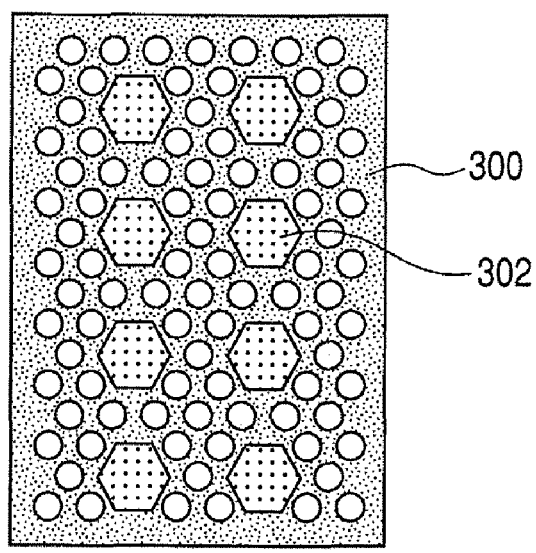
FIG. 6 is a schematic plan view illustrating an organic light-emitting apparatus having a periodic structure.

The periodic structure 300 is not limited to the two-dimensional photonic crystal structure as described above, and may be a combination of one-dimensional diffraction gratings such as shown in FIG. 5. Further, a plurality of emission regions 302 may be present in one sub-pixel such as shown in FIG. 6. Further, the periodic structure 300 is not required to be completely periodic, and may be a quasi-crystalline structure, a structure in which a periodic structure varies continuously, a structure having an irregular scattering structure partially, or a combination of those structures and the periodic structure.

The organic compound used in the hole-transporting layer 106, the emission layer 105, the electron-transporting layer 107, the hole injection layer 108, and the electron injection layer 109 shown in FIG. 3 is composed of a low-molecular material, a polymeric material, or both of them without any limitation. Further, an inorganic compound may be used as needed.

Incidentally, the description has been made by taking, as an example, the structure in which the substrate side serves as an anode. However, the present invention is not particularly limited thereto, and can be carried out even in the structure in which the substrate side serves as a cathode.

Moreover, the present invention can also be carried out even in a bottom emission structure in which a transparent electrode is formed on a transparent substrate, and an organic layer and a reflective electrode are stacked on the transparent electrode.

Further, the present invention can be carried out even in a multi-photon structure or a stacked structure in which a plurality of OLED devices are stacked.

Hereinafter, evaluation examples and comparative examples based on numerical calculation will be described. For the numerical calculation of an electromagnetic wave, a two-dimensional FDTD method is used, considering the cross-section of the organic light-emitting apparatus.

COMPARATIVE EXAMPLE 1

Figure 7:
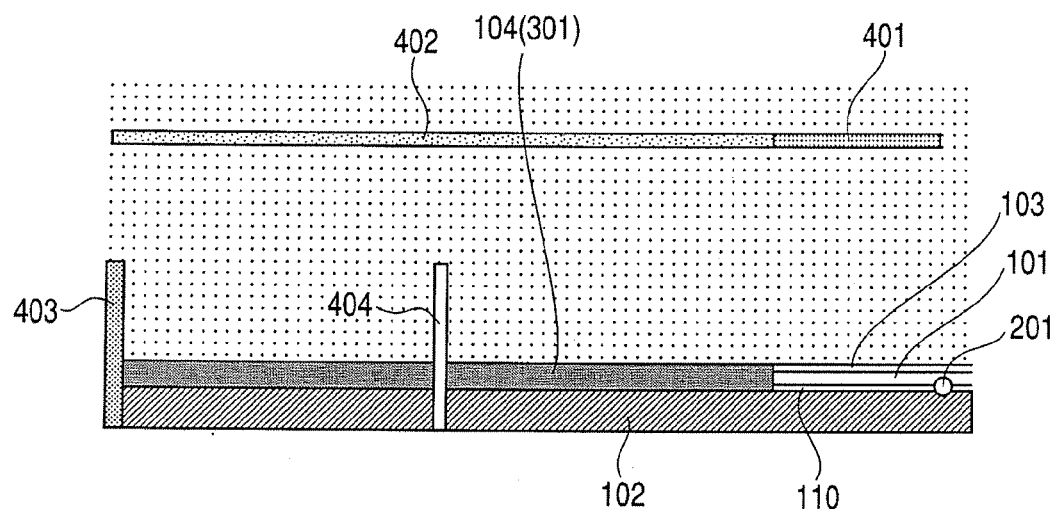
FIG. 7 is a structural example of a numerical calculation regarding an organic light-emitting apparatus having no periodic structure.

FIG. 7 illustrates a structure in which a device separation layer 104 does not have a periodic structure and has only an optical waveguide 301.

In a light-emitting portion of the OLED device, a reflective electrode 102 (thickness: 60 nm, refractive index (real part): 0.15, and refractive index (imaginary part): 3.58) is formed on a substrate. Further, on the reflective electrode 102, a transparent electrode 110 (thickness: 20 nm, refractive index: 2.0), and an organic layer 101 (thickness: 70 nm, refractive index: 1.7) are formed. Further, a transparent electrode 103 (thickness: 60 nm, refractive index: 2.0) is formed on the organic layer 101 to form a stack structure. The optical path length was set with respect to light having a wavelength λ of about 460 nm such that interference and emission enhancement was caused in a direction perpendicular to the substrate 100 and a microcavity structure was obtained. That is, the microcavity structure was formed in a stack direction of the OLED device. The refractive index of the device separation layer 104 disposed on the side surface of the OLED device was set to be 2.0.

Further, it was presumed that a light-emitting source existed at an emission point 201 in the organic layer 101 which was distant by 1.0 μm from the boundary with the device separation layer 104, and monochromatic light with an emission wavelength λ=460 nm in a steady concentric shape was emitted therefrom. Calculation was performed with an electromagnetic mode in a TE mode.

Further, a measurement region A (401), a measurement region B (402), a measurement region C (403), and a measurement region D (404) are provided, and an amount of energy passing through each measurement region was calculated.

The above setting is common to each evaluation example and Comparative Example 1.

Figure 8:
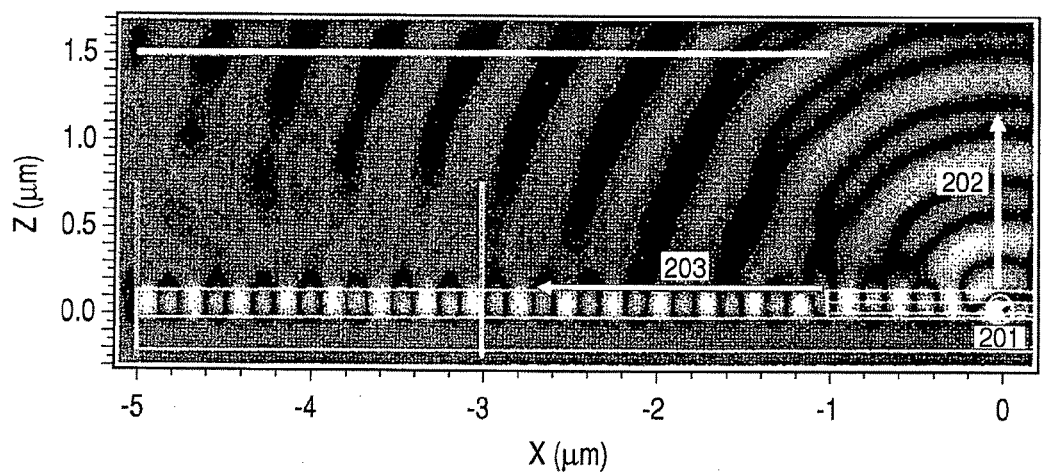
FIG. 8 is an exemplary result (Contour Map of Ey) of a numerical calculation regarding an organic light-emitting apparatus having no periodic structure.

In Comparative Example 1, the thickness of the device separation layer 104 was set to be 150 nm. FIG. 8 illustrates numerical calculation results in the case where the device separation layer 104 has only the optical waveguide 301. It can be seen that the light extracted out of the OLED device of the light emitted from the emission point 201 is only the part of the propagating light 202, and most of the remaining part is confined as the guided-wave light 203 in a direction parallel to the substrate surface.

Here, the effective refractive index $n_{eff}$ and the effective absorption coefficient $k_{eff}$ of the guided-wave light 203 were determined. The real part of the propagation coefficient β of the guided-wave light 203 was about 0.0225 [1/nm] with reference to FIG. 8. From this, the effective refractive index $n_{eff}$ was determined to be about 1.65.

Next, the effective absorption coefficient $k_{eff}$ was determined. Assuming that the energy at a position X1 of the guided-wave light 203 is $I(X_1)$, and the energy at a position X2 is $I(X_2)$ on an X-axis coordinate of FIG. 8, a relationship represented by Equation 16 is established between the energy $I(X_1)$ and the energy $I(X_2)$, and the effective absorption coefficient $k_{eff}$.

$$I(x_2) = I(x_1)\exp[-2\kappa_{eff}k(x_2-x_1)] \quad \text{(Equation 16)}$$

Since the transmission energy amount in the measurement region C (403) is I(5 μm)=0.0124 [a.u.], and the transmission energy amount in the measurement region D (404) is I(3 μm)=0.0144 [a.u.], the effective absorption coefficient was determined to be $k_{eff}$=about 0.0028 according to Equation 16.

According to the effective absorption coefficient $k_{eff}$=about 0.0028, a half-value distance $X_{half}$ required for the energy of the guided-wave light 203 to be reduced to a half was determined to be 9.1 μm (about 10 μm).

EVALUATION EXAMPLE 1

Figure 9:
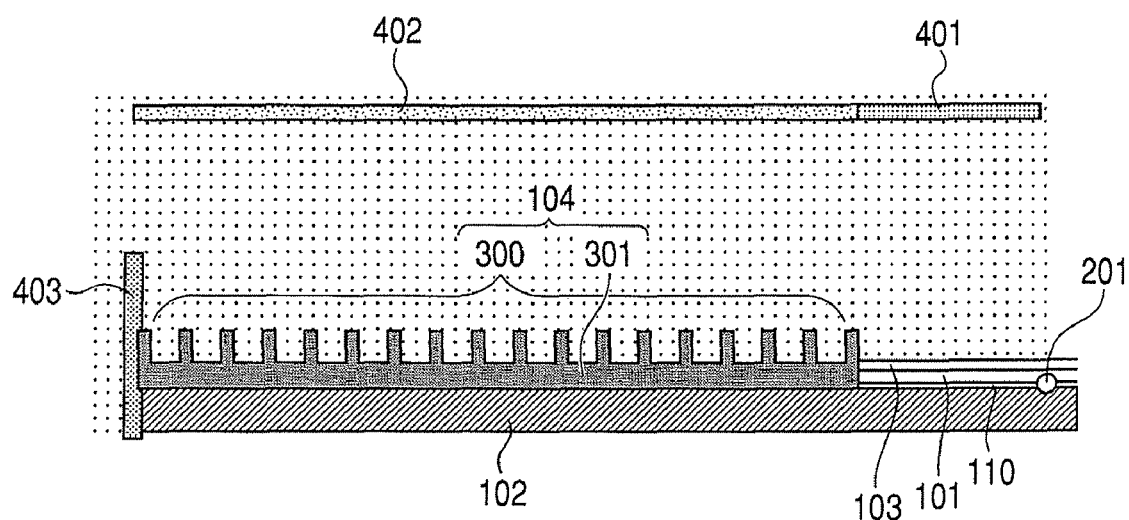
FIG. 9 is a structural example of a numerical calculation regarding an organic light-emitting apparatus having a periodic structure.
Figure 10:
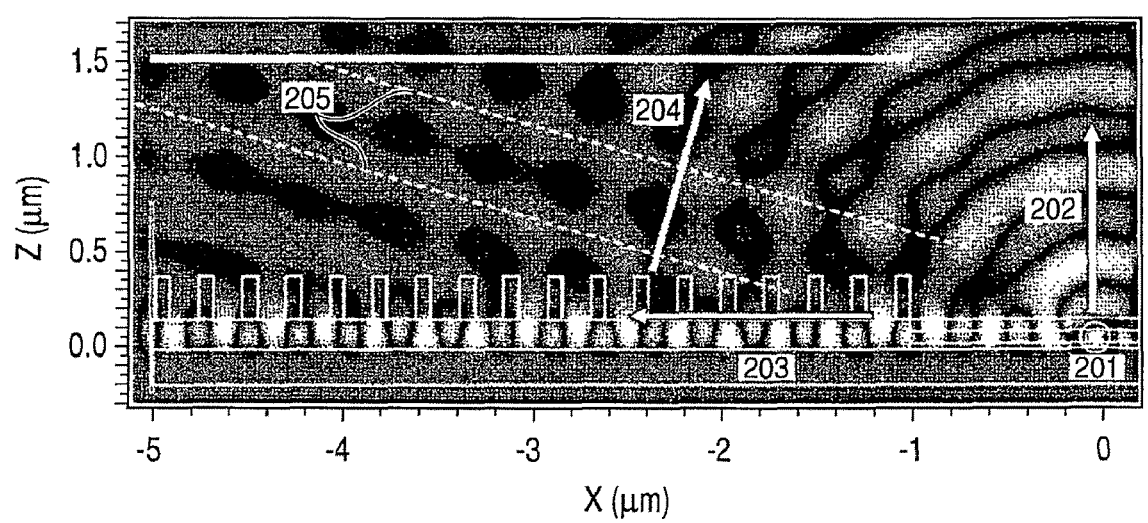
FIG. 10 is an exemplary result (Contour Map of Ey) of a numerical calculation regarding an organic light-emitting apparatus having a periodic structure.

Next, as a structural example of the light-emitting apparatus of the present invention, numerical calculation results obtained in the case of forming a periodic structure 300 on an optical waveguide 301 of the device separation layer 104 as illustrated in FIG. 9 will be illustrated. FIG. 9 illustrates the case where the height h of the periodic structure is 230 nm, and the period a thereof is 230 nm. FIG. 10 illustrates numerical calculation results in this case.

When the effective refractive index $n_{eff}=1.65$ of the guided-wave light 203 was substituted into Equation 11 that was a phase matching condition, it was found that only 1st-order diffracted light was generated and the diffraction angle thereof was −20.5°. Incidentally, regarding the diffraction angle, the angle direction smaller than 90° with respect to the propagation direction of guided-wave light in the optical waveguide is assumed to be positive, and the angle direction greater than 90° with respect to the propagation direction of guided-wave light in the optical waveguide is assumed to be negative. The diffraction angle calculated from the phase matching condition is well matched with the diffraction angle of the diffracted light 204 determined from a diffracted light wave front 205 illustrated in the calculation results of FIG. 10.

The period a of the periodic structure 300 was varied at an interval of 115 nm from 115 nm to 920 nm, and the energy passing through the measurement region A and the measurement region B corresponding to the extraction light obtained by combining the propagating light 202 with the diffracted light 204 was obtained. Table 1 illustrates relative values with the value of Comparative Example 1 having no periodic structure 300 being used as a reference (1.00).

TABLE 1

| Periodic structure (Period) | None | 115 nm | 230 nm | 345 nm | 460 nm | 575 nm | 690 nm | 805 nm | 920 nm |
|---|---|---|---|---|---|---|---|---|---|
| Measurement region A + B | 1.00 | 0.96 | 1.20 | 1.13 | 1.62 | 1.73 | 1.78 | 1.61 | 1.49 |

The case where the period a is 115 nm does not satisfy Equation 13 that is a condition for occurrence of diffraction, and the diffracted light 204 is not generated. Therefore, the light extraction efficiency is substantially the same as that of Comparative Example 1.

On the other hand, in the case where the period a is in the range of 230 nm to 920 nm, it can be seen that the light extraction efficiency is improved due to the diffraction effect. In particular, in the case where the period a is in the range of 460 nm to 805 nm, the light extraction efficiency is improved remarkably.

Figure 11:
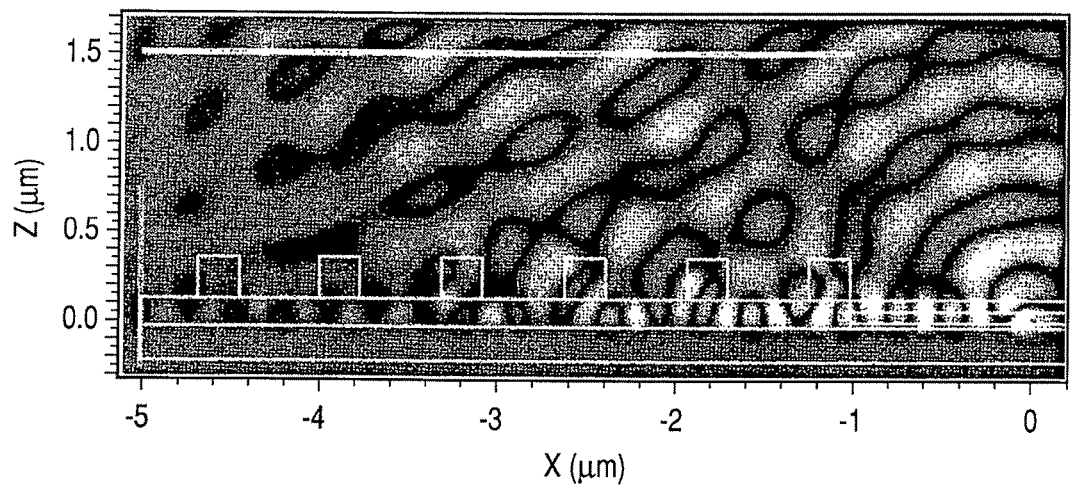
FIG. 11 is an exemplary result (Contour Map of Ey) of a numerical calculation regarding an organic light-emitting apparatus having a periodic structure.

The light extraction efficiency became maximum when the period a was 690 nm. FIG. 11 illustrates the numerical calculation results when the period a is 690 nm. In the case where the period a is 690 nm, 1st-order to 3rd-order diffracted light is generated, and it is considered that, of those, the 2nd-order diffracted light and the 3rd-order diffracted light are generated simultaneously in a direction of close to the direction perpendicular to the substrate and in a direction of −20.5°, respectively.

EVALUATION EXAMPLE 2

The efficiency of conversion from the guided-wave light 203 to the diffracted light 204 due to diffraction can be adjusted by changing the height h of the periodic structure 300. As a structural example of the light-emitting apparatus of the present invention, the height h was changed from 115 nm to 460 nm in the case where the period a of the periodic structure 300 was constant (230 nm), whereby energy passing through the measurement regions A and B was determined. Table 2 illustrates relative values with the value of Comparative Example 1 having no periodic structure 300 being used as a reference (1.00). It can be seen that, when the height h is 115 nm and 460 nm, the diffracted light 204 is more strengthened and the light extraction efficiency is more improved.

TABLE 2

| Periodic structure (Height) | None | 115 nm | 230 nm | 345 nm | 460 nm |
|---|---|---|---|---|---|
| Measurement region A + B | 1.00 | 1.47 | 1.20 | 1.30 | 1.44 |

EVALUATION EXAMPLE 3

Figure 12:
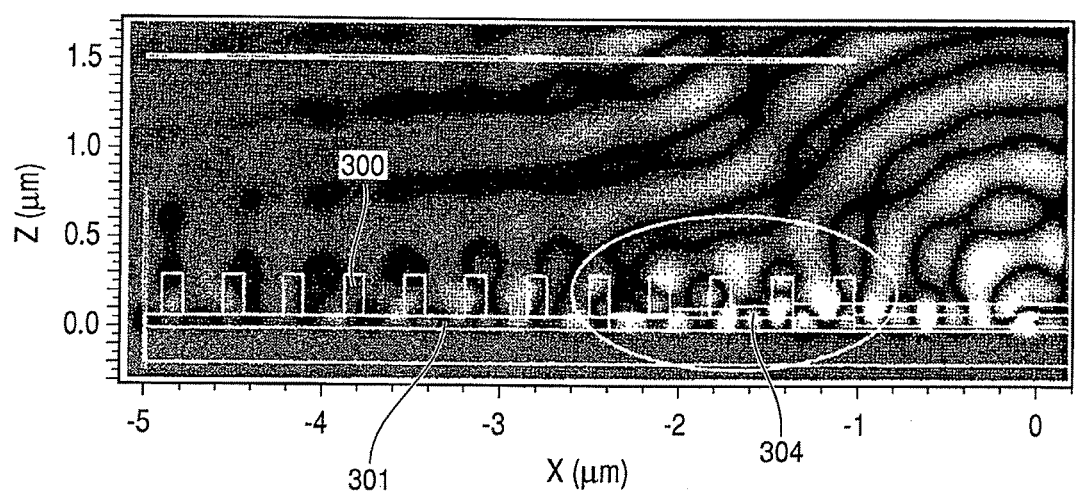
FIG. 12 is an exemplary result (Contour Map of Ey) of a numerical calculation regarding an organic light-emitting apparatus having a periodic structure.

In order to control the efficiency of conversion from the guided-wave light 203 to the diffracted light 204, it is extremely effective to adjust the height d of the optical waveguide 301 to change the effective refractive index $n_{eff}$ of the guided-wave light 203. As a structural example of the light-emitting apparatus of the present invention, the energy passing through the measurement region A and the measurement region B was determined in the case where the period a of the periodic structure was set to be constant (230 nm) and the height d of the optical waveguide 301 was changed from 150 nm to 70 nm. FIG. 12 illustrates numerical calculation results.

A structure was employed, in which the height of the optical waveguide changes continuously, specifically the height d of the optical waveguide 301 is decreased continuously according to the so-called chirp structure. Table 3 illustrates the energy passing through the measurement regions A and B in the cases where the height d of the optical waveguide 301 was set to be constant (150 nm), the height d was changed from 150 nm to 70 nm, and the height d was changed from 150 nm to 30 nm. The value of Comparative Example 1 having no periodic structure 300 is used as a reference (1.00).

TABLE 3

| Periodic structure | None | Period 230 nm, Height 230 nm | | |
|---|---|---|---|---|
| Optical waveguide (height) | Constant (150 nm) | | 150 nm → 70 nm | 150 nm → 30 nm |
| Measurement region A + B | 1.00 | 1.20 | 1.83 | 1.71 |

It can be seen from the results illustrated in Table 3 that by introducing the chirp structure 304 and reducing the height d of the optical waveguide 301, the diffracted light intensity is increased remarkably, and the light extraction efficiency is improved. The reason for this is considered as follows. The effective refractive index $n_{eff}$ becomes close to a lower limit value $n_{ex}$, whereby light leakage from the optical waveguide due to an evanescent wave becomes large. Consequently, the light is more likely to be influenced by the periodic structure, or the guided mode disappears.

The half-value distance $X_{half}$ of the guided-wave light 203 was about 10 μm according to the calculation example of Comparative Example 1. Thus, considering that the transmission distance of the guided-wave light 203 in the direction parallel to the substrate is approximately the half-value distance, the transmission distance is about 10 μm. As illustrated in FIG. 1, in the case where the periodic structure 300 is provided to the device separation layer 104, the region in which light can be extracted due to the diffraction effect of the periodic structure disposed on the device separation layer is mostly within about 10 μm from the boundary between the device separation layer and the organic layer. Thus, in FIG. 2, the range of the diffracted light region 303 as the additional emission region is about 10 μm from the boundary.

In the case where the area of the emission region 302 of FIG. 2 is extremely large, the contribution of the peripheral portion to the improvement of the light extraction efficiency is relatively small. Conversely, when the size of a sub-pixel is made fine from one hundred and several tens μm square to several tens μm square along with the increase in display resolution up to about 150 ppi to 300 ppi, the contribution of the peripheral portion to the improvement of the light extraction efficiency increases, which can enhance the emission efficiency. Further, as illustrated in FIG. 6, by providing a plurality of emission regions 302 in one sub-pixel, the contribution of the peripheral portion can be increased, thereby improving the emission efficiency.

In general, in a display apparatus, a high contrast is required in order to enhance the visibility. Particularly, in a display apparatus that is frequently used outdoors, such as a small display, the function of preventing reflection of ambient light is extremely important so as to keep a contrast. As an effective method of preventing reflection with respect to an organic EL display apparatus, there is a method in which a circularly polarizing plate is provided or a method in which a resonator interference canceling effect is combined with a color filter. However, since the methods are effective for an organic EL display apparatus having a plane structure, if a periodic structure or a diffraction grating is disposed so as to improve the light extraction efficiency, the reflection preventing performance will be degraded. Therefore, it is desired to have a structure which can maintain a reflection preventing function.

Hereinafter, a structural example in which the display apparatus of the present invention is allowed to have the function of preventing reflection of ambient light will be described with reference to FIGS. 18, 19, and 20.

Figure 18:
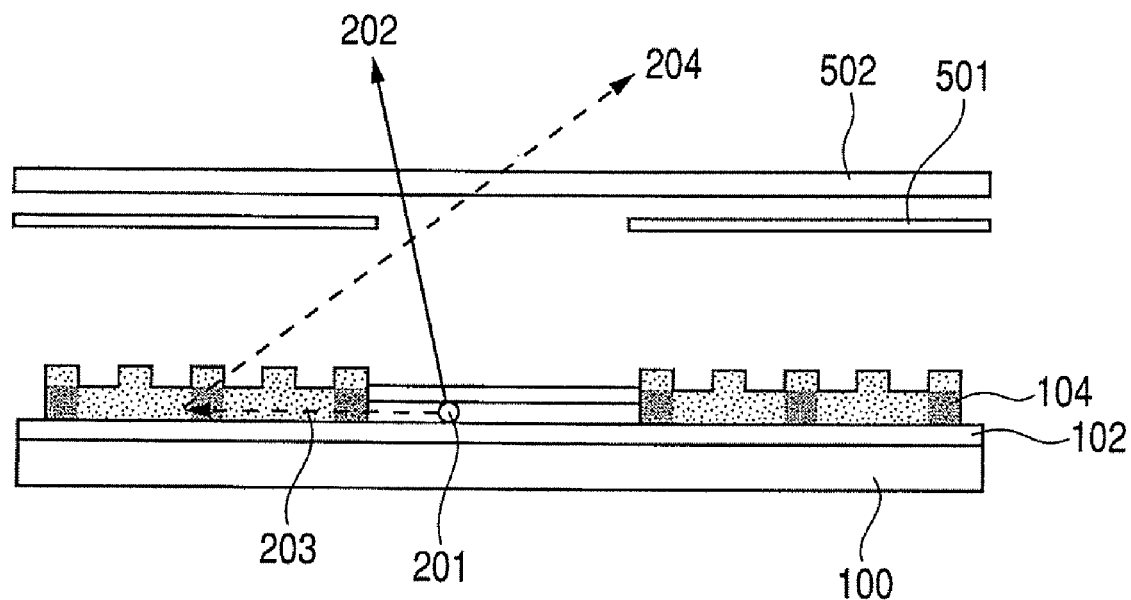
FIG. 18 is a schematic view (during light emission) illustrating an organic light-emitting apparatus having a periodic structure, a black matrix, and a circularly polarizing plate.

As illustrated in FIG. 18, according to the present invention, a black matrix 501 is disposed at a portion above the periodic structure of the display apparatus, and a circularly polarizing plate 502 is further disposed above the black matrix 501. In the case where the display apparatus has a plurality of light-emitting devices, the periodic structure formed on the periphery of the light-emitting device is formed between adjacent light-emitting devices. The black matrix is also formed between the adjacent light-emitting devices.

The propagating light 202 from the emission point 201 is radiated outside of the display apparatus through an opening of the black matrix 501. Further, at a wavelength of light desired to be extracted outside, it is desired that a diffracted light 204 has a negative diffraction angle with respect to the guided-wave light 203 in an optical waveguide so as to be radiated outside through the opening of the black matrix 501. The term "negative diffraction angle" herein employed means to have an angle larger than 90° with respect to the propagation direction of the guided-wave light 203. Further, it is desired that the light extracted outside via the periodic structure have a maximum intensity or maximum luminance at an angle direction larger than 90° with respect to the propagation direction of the guided-wave light in the optical waveguide.

The condition under which a diffracted light has a negative diffraction angle is as follows in accordance with the diffraction condition of Equation 3. That is, the condition under which a diffracted light has a negative diffraction angle is given substantially by Equation 17 where X represents the peak wavelength of a spectrum of light desired to be extracted outside via a periodic structure, two integers $m_1$ and $m_2$ represent diffraction orders, θ ($m_1$, $m_2$) represents the diffraction angle with respect to the direction normal to the substrate, and the condition of $n_{ex} < n_{eff} < n$ is given.

$$n_{ex} < \frac{\lambda}{2\pi}|m_1 b_1 + m_2 b_2| < n + n_{ex} \qquad \text{(Equation 17)}$$

Further, the condition under which a diffracted light has a negative diffraction angle in the case of a tetragonal lattice is given substantially by Equation 18 according to the diffraction condition of Equation 8, with the period of the tetragonal lattice being represented by a.

$$\frac{\sqrt{m_1^2 + m_2^2}}{n + n_{ex}}\lambda < a < \frac{\sqrt{m_1^2 + m_2^2}}{n_{ex}}\lambda \qquad \text{(Equation 18)}$$

Figure 19:
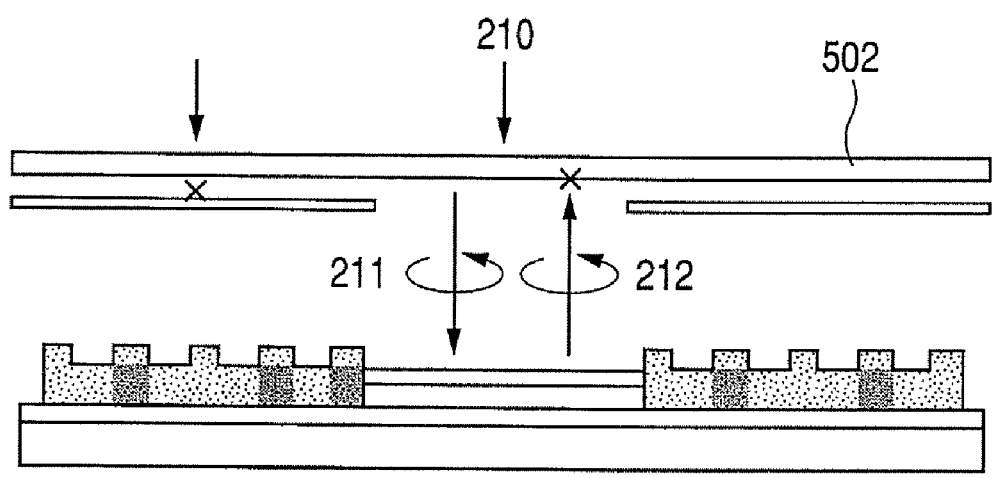
FIG. 19 is a schematic view (during perpendicular incidence) illustrating an organic light-emitting apparatus having a periodic structure, a black matrix, and a circularly polarizing plate.

FIG. 19 is a schematic view in the case where ambient light is incident on a display apparatus of the present invention at an angle close to 90°. Of the incident light (approximately in a perpendicular direction) 210, the light incident on the EL emission region is prevented from being reflected by the circularly polarizing plate 502. Further, the light incident on a portion above the periodic structure is prevented from being reflected by the black matrix.

Figure 20:
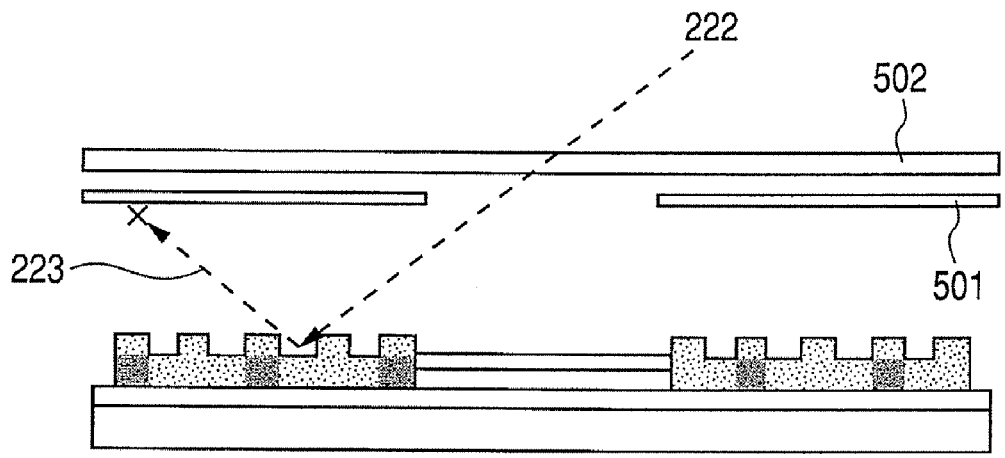
FIG. 20 is a schematic view (during oblique incidence) illustrating an organic light-emitting apparatus having a periodic structure, a black matrix, and a circularly polarizing plate.

Next, FIG. 20 is a schematic view in the case where ambient light is incident on a display apparatus of the present invention from an oblique direction.

Obliquely incident light 222 passes through the circularly polarizing plate 502 to become circularly polarized light, and thereafter, is reflected by the periodic structure to become obliquely reflected light 223. The obliquely reflected light 223 becomes elliptically polarized light from the circularly polarized state by the periodic structure, and is absorbed by the black matrix 501 and therefore prevented from being reflected.

Thus, reflected light with respect to incidence of ambient light can be reduced while disposing the periodic structure to thereby improve the light extraction efficiency.

Figure 21:
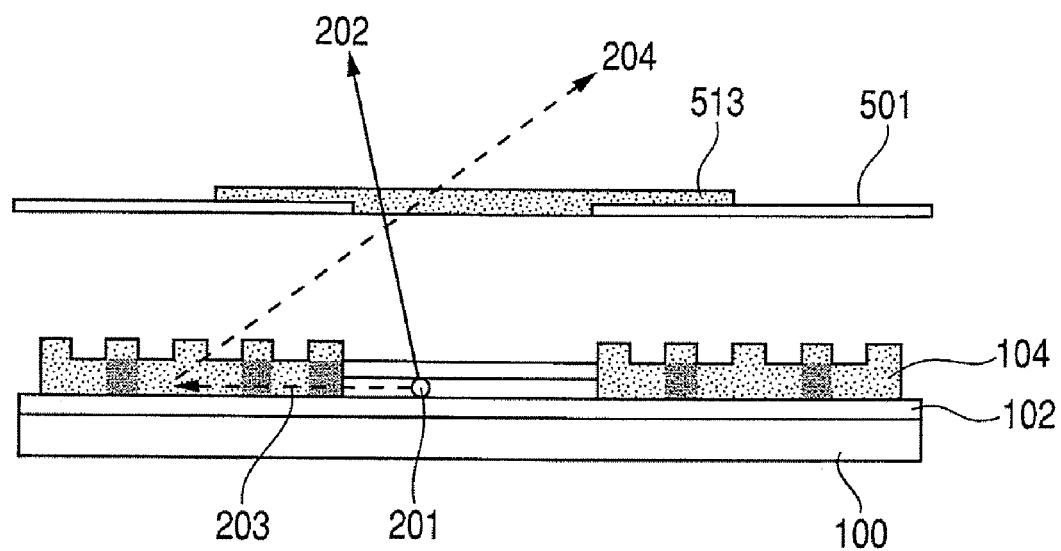
FIG. 21 is a schematic view (during light emission) illustrating an organic light-emitting apparatus having a periodic structure, a black matrix, and a color filter.
Figure 22:
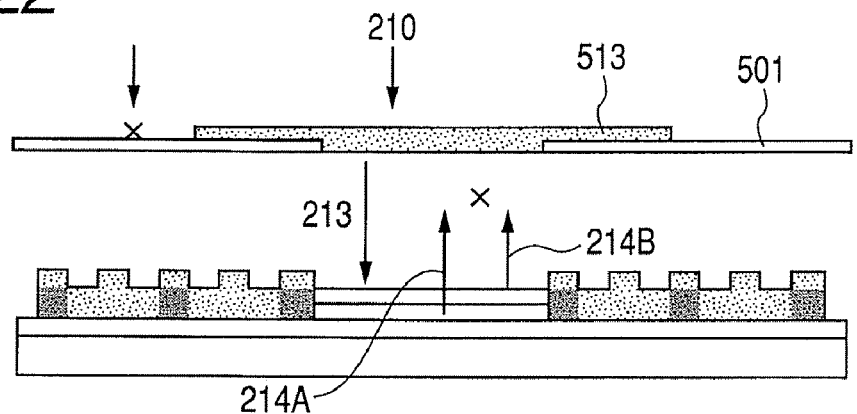
FIG. 22 is a schematic view (during perpendicular incidence) illustrating an organic light-emitting apparatus having a periodic structure, a black matrix, and a color filter.
Figure 23:
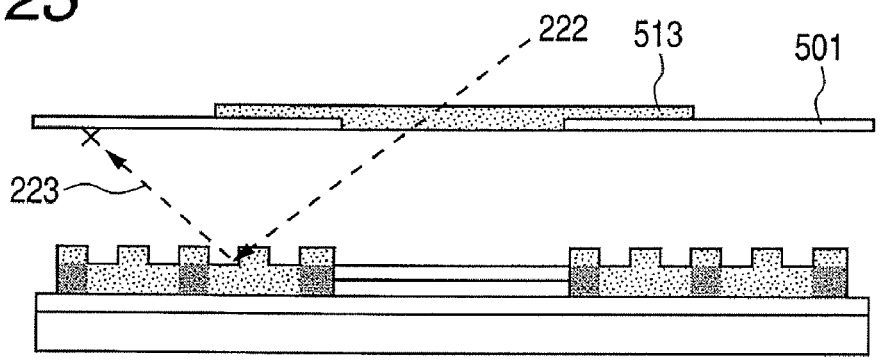
FIG. 23 is a schematic view (during oblique incidence) illustrating an organic light-emitting apparatus having a periodic structure, a black matrix, and a color filter.

Similarly, FIGS. 21, 22, and 23 illustrate other configuration examples in which a display apparatus of the present invention is allowed to have the function of preventing the reflection of ambient light.

In FIG. 21, it is assumed that the light-emitting device constituting the display apparatus is a red-light-emitting device (hereinafter, referred to as R device) with an emission color of R (red) and is a microcavity device (R microcavity device) strengthening red color. A black matrix 501 is disposed at a portion above a periodic structure of the display apparatus, and further, a color filter (R color filter) 513 transmitting red light is disposed at an opening of the black matrix. The light extraction is the same as that in the case of FIG. 18.

FIG. 22 is a schematic view in the case where ambient light is incident on a display apparatus of the present invention at an angle close to 90°. Of the incident light (approximately in a perpendicular direction) 210, the light incident on the emission region becomes red transmitted light (R transmitted light) 213 by the R color filter 513. In the microcavity, the condition of interference enhancement in the microcavity is substantially matched with the condition of interference cancellation to the reflected light. Therefore, in the R microcavity device that enhances red (R emission color), red reflected light (R reflected light) 214A and 214B from respective interfaces of the R microcavity device interfere with the R transmitted light 213 and cancel each other, thereby enabling suppression of reflection. Further, the light incident on a portion above the periodic structure is prevented from being reflected by the black matrix.

The case where ambient light is incident from an oblique direction, which is illustrated in FIG. 23, is the same as that of FIG. 20. The description has been made by taking R (red) as an example, but the description also applies to G (green) and B (blue).

Although the structure in which the substrate side serves as an anode, and the light extraction side serves as a cathode has been described, the present invention can also be carried out even in a structure in which the substrate side serves as a cathode, the light extraction side serves as an anode, and the hole-transporting layer, the emission layer, and the electron-transporting layer are stacked in an opposite order. Thus, the display apparatus according to present invention is not limited to the structure in which the substrate side serves as an anode and the light extraction side serves as a cathode.

Figure 24:
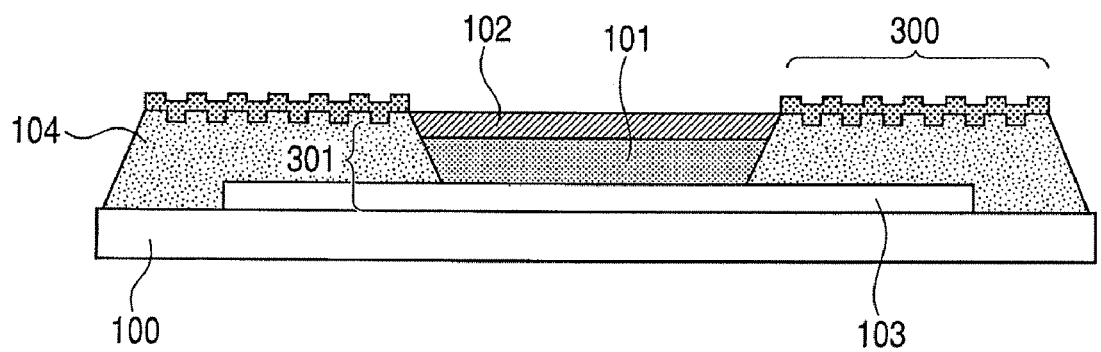
FIG. 24 is a schematic cross-sectional view illustrating a bottom emission type organic light-emitting apparatus having a periodic structure.

Further, as illustrated in FIG. 24, the present invention can also be carried out in a bottom emission structure in which a transparent electrode is formed on a transparent substrate, and an organic layer and a reflective electrode are stacked on the transparent electrode. In this case, the optical waveguide 301 is located between the bottom portion of the periodic structure excluding a reflective electrode portion, and the substrate (interface between the transparent electrode 103 and the substrate 100).

Figure 15:
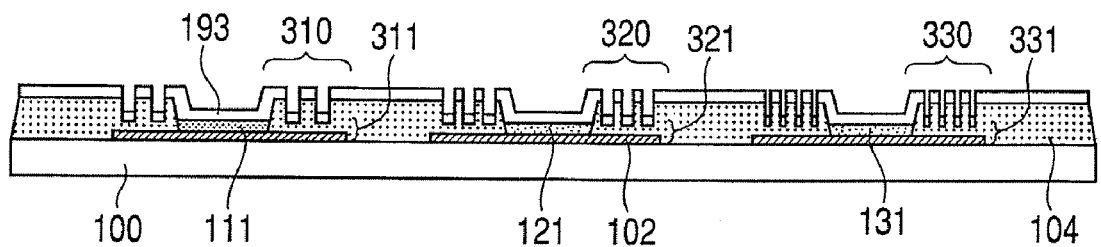
FIG. 15 is a schematic cross-sectional view illustrating an organic light-emitting apparatus of an RGB-emission layer separately applied structure using a metal semi-transparent electrode having a periodic structure.

Further, the structure in which the electrode on the light extraction side is a transparent electrode has been described, but the present invention can also be carried out in a structure in which the electrode on the light extraction side is a metal semi-transparent electrode 193 as illustrated in FIG. 15. In this case, the optical waveguide is located between the bottom portion of the periodic structure 300 excluding the metal semi-transparent electrode 193 and the reflective electrode 102.

Further, in this structure, a surface plasmon is generated, which can be considered as a kind of guided-wave light propagating in a direction parallel to the substrate through the interface between the metal semi-transparent electrode 193 and the device separation layer 104 (or the RGB common organic layer). Thus, the interface between the metal semi-transparent electrode 193 and the device separation layer 104 (or the RGB common organic layer) can be utilized as an optical waveguide. Assuming that a propagation coefficient of the surface plasmon is $\beta_{SP}$ and the propagation coefficient of Equation 2 is $\beta$, the diffraction condition is given by Equation 3 as is the case with ordinary guided-wave light.

The embodiments of the light-emitting apparatus of the present invention have been described above. The light-emitting apparatus of the present invention can be applied to various applications such as a display apparatus, illumination, a backlight for a display apparatus, etc. Examples of the display apparatus include a television receiver, a display of a personal computer, a rear side display portion of an imaging apparatus, a display portion of a mobile phone, a display portion of a mobile game machine, a display portion of an portable audio player, a display portion of a personal digital assistant (PDA), a display portion of a car navigation system.

EXAMPLES

Hereinafter, the production of a light-emitting apparatus of the present invention will be described as examples, but the present invention is not limited to the examples.

Example 1

Figure 13:
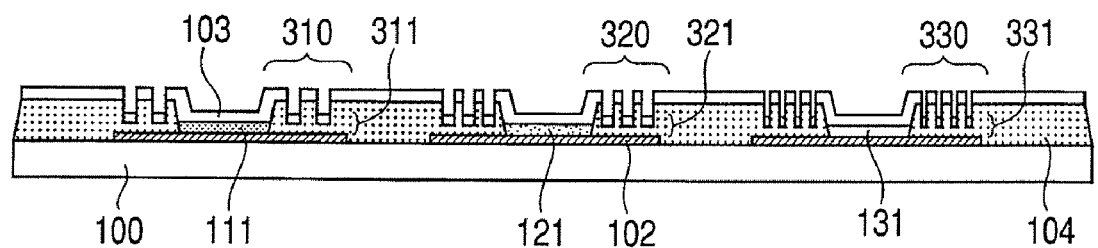
FIG. 13 is a schematic cross-sectional view illustrating an organic light-emitting apparatus of an RGB-emission layer separately applied structure having a periodic structure.

A full-color organic light-emitting apparatus of a structure illustrated in FIG. 13 is produced by the method described below. More specifically, the light-emitting apparatus of this example is an organic light-emitting apparatus having a plurality of pixels, each pixel being composed of a red-light-emitting device, a green-light-emitting device, and a blue-light-emitting device (i.e., sub-pixels of three colors of red, green, and blue), and can be applied preferably as a display apparatus. Hereinafter, the red-light-emitting device is referred to as an R device, the green-light-emitting device is referred to as a G device, and the blue-light-emitting device is referred to as a B device.

First, a TFT driving circuit made of low-temperature polysilicon is formed on a glass substrate 100 as a support member, and a planarizing film made of an acrylic resin is formed on the TFT driving circuit to obtain a substrate. A film of an Ag alloy (AgPdCu) as a reflective metal is formed in a thickness of about 100 nm by sputtering thereon and patterned, and a film of IZO as a transparent conductive film is formed in a thickness of 20 nm by sputtering and patterned, thereby forming a reflective electrode 102. The reflective electrode 102 made of the Ag alloy is a highly reflective electrode with a spectral reflectance of 80% or more in a wavelength region ($\lambda$=380 nm to 780 nm) of visible light.

Further, a device separation layer 104 of SiNxOy (silicon oxynitride) is formed in a thickness of 320 nm, and thereafter, each sub-pixel is subjected to etching to form the emission region 302 and the periodic structure 310 (320, 330) of a triangular lattice such as illustrated in FIG. 2, whereby an anode substrate with a photonic crystal structure is produced.

Here, the emission region 302 has a 50 μm square shape. In this example, the periodic structure (R periodic structure) 310 of the R device has a period of 930 nm, an etching diameter of 620 nm, and an etching depth of 180 nm. The periodic structure (G periodic structure) 320 of the G device has a period of 795 nm, an etching diameter of 530 nm, and an etching depth of 210 nm. The periodic structure (B periodic structure) 330 of the B device has a period of 690 nm, an etching diameter of 460 nm, and an etching depth of 230 nm. That is, the period of the periodic structure is the longest in the R device and is the shortest in the B device.

The anode substrate thus produced is ultrasonically cleaned with isopropyl alcohol (IPA), and washed with boiled water, followed by drying. After that, the resultant is cleaned with UV/ozone, and organic layers 111, 121, and 131 of the R device, the G device, and the B device are formed by vacuum vapor deposition, respectively.

First, Compound (I) represented by the following structural formula is vacuum vapor deposited in a thickness of 50 nm as a hole-transporting layer of the R device, in a thickness of 30 nm as a hole-transporting layer of the G device, and in a thickness of 20 nm as a hole-transporting layer of the B device, respectively, in each sub-pixel, using a shadow mask. The vacuum degree at this time is $1 \times 10^{-4}$ Pa, and the vapor deposition rate is 0.2 nm/sec.

Compound (I)

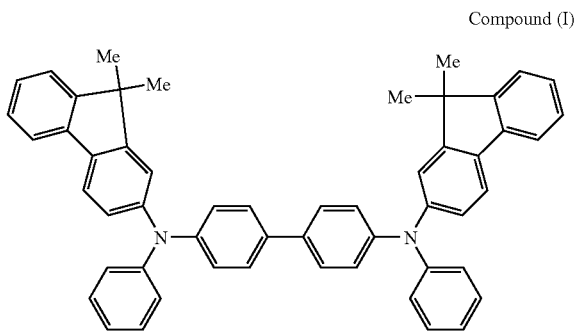

Next, an emission layer of each of the R device, the G device, and the B device is formed using a shadow mask. As the emission layer of the R device, 4,4'-bis(N-carbazole)biphenyl (hereinafter, referred to as CBP) as a host and bis[2-(2'-benzothienyl)pyridinato-N,C3](acetylacetonato)Iridium (hereinafter, referred to as Btp2Ir(acac)) as a phosphorescent compound are co-deposited to form an emission layer with a thickness of 60 nm. As the emission layer of the G device, tris-(8-hydroxyquinoline)aluminum (hereinafter, referred to as Alq3) as a host and 3-(2'-Benzothiazolyl)-7-N,N-diethylaminocoumarin (hereinafter, referred to as coumarin 6) as a light-emitting compound are co-deposited to form an emission layer with a thickness of 40 nm. As the emission layer of the B device, Compound (II) represented by the structural formula shown below as a host and Compound (III) represented by the structural formula shown below as a light-emitting compound are co-deposited to form an emission layer with a thickness of 20 nm. The vacuum degree during vapor deposition is $1 \times 10^{-4}$ Pa and the film formation speed is 0.2 nm/sec.

Compound (II)

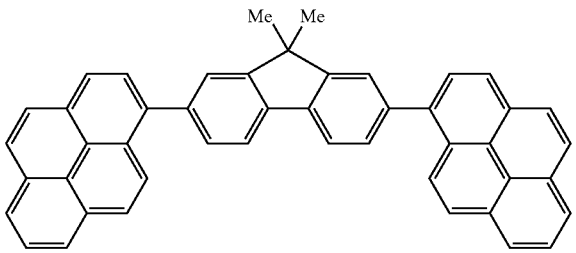

Compound (III)

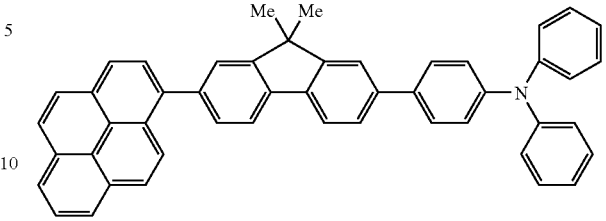

Further, as a common electron-transporting layer, a film of 1,10-bathophenanthroline (hereinafter, referred to as BPhen) is formed in a thickness of 10 nm by vacuum vapor deposition for all of the devices of the three colors. The vacuum degree during vapor deposition is $1 \times 10^{-4}$ Pa, and the film formation speed is 0.2 nm/sec. Next, as a common electron injection layer, BPhen and $Cs_2CO_3$ are co-deposited (weight ratio is 90:10) to form a film in a thickness of 20 nm for all of the devices of the three colors. The vacuum degree during vapor deposition is $3 \times 10^{-4}$ Pa, and the film formation speed is 0.2 nm/sec.

The substrate having the layers including the electron injection layer formed thereon is moved to a sputtering apparatus without breaking the vacuum, and a film of ITO is formed to have a thickness of 60 nm as a transparent electrode 103.

Consequently, in the device separation layer 104, an optical waveguide 311 (321, 331) is formed between the bottom portion of the periodic structure 310 (320, 330) and the reflective electrode 102. Here, on the periodic structure 310 formed on the device separation layer 104, the common layers formed extending over the R device, the G device, and the B device are stacked. Although only the transparent electrode is illustrated in FIGS. 1 and 13, the electron-transporting layer, the electron injection layer, and the transparent electrode are stacked successively in Example 1. Here, it is preferred that the refractive index of the transparent electrode 103 and the refractive index of the organic layer 111 (121, 131) are substantially equal to the refractive index of the device separation layer 104. This is because the transparent electrode 103 stacked on the device separation layer 104 can be regarded as the same member as the device separation layer 104, and therefore because the periodic structure 310 (320, 330) and the optical waveguide 311 (321, 331) can be formed.

Further, a desiccant is disposed at the periphery of the light-emitting apparatus, and the apparatus is sealed with etched cap glass, whereby an organic EL light-emitting apparatus is obtained.

Example 2

Figure 14:
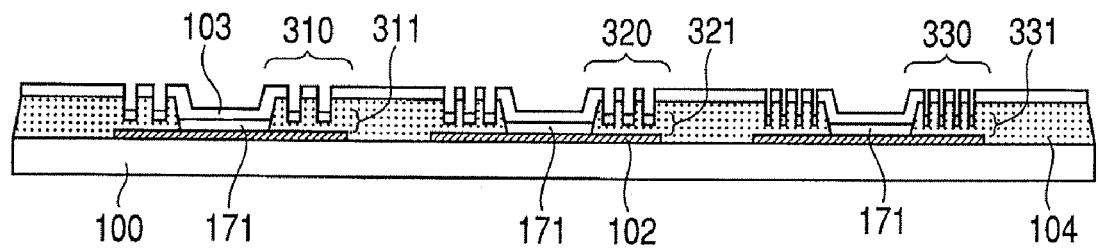
FIG. 14 is a schematic cross-sectional view illustrating an organic light-emitting apparatus of a W-emission layer commonly applied structure having a periodic structure.

FIG. 14 is a structural view of an organic 1L light-emitting apparatus of Example 2. The production process of Example 2 is the same as Example 1 before the formation of the hole-transporting layer. In each sub-pixel, a film of Compound (I) above is formed as a hole-transporting layer of an R device in a thickness of 70 nm, as a hole-transporting layer of a G device in a thickness of 40 nm, and as a hole-transporting layer of a B device in a thickness of 20 nm, respectively. Next, as a common 3-color stack type white (W) emission layer, CBP and bis[(4,6-difluorophenyl)pyridinato-N,C2] (picolinato)Iridium (hereinafter, referred to as FIrpic) are co-deposited in a thickness of 25 nm. Then, CBP and Btp2Ir(acac)

(weight ratio 92:8) are co-deposited in a thickness of 2 nm. Further, CBP and bis(2-phenylbenzothiozolato-N—C2)Iridium(acetylacetonate) (hereinafter, referred to as Bt2Ir(acac)) (weight ratio is 92:8) are co-deposited in a thickness of 2 nm, thereby obtaining a stack structure. The process for the formation of the electron-transporting layer and the subsequent layers is the same as that of Example 1.

More specifically, the organic light-emitting apparatus of this example has a structure in which a W organic layer 171 is formed in each sub-pixel, whereby a white OLED device is provided.

Example 3

FIG. 15 is a structural view of an organic light-emitting apparatus of Example 3. The process for the formation of the layers up to and including the electron injection layer is the same as that of Example 1. The substrate having the layers up to and including the electron injection layer formed thereon is moved to a sputtering apparatus without breaking the vacuum, and a film of an Ag alloy is formed to have a thickness of 20 nm as a metal semi-transparent electrode 193.

Further, a desiccant is disposed at the periphery of the light-emitting apparatus, and the apparatus is sealed with etched cap glass, whereby an organic light-emitting apparatus is obtained.

More specifically, the organic light-emitting apparatus of this example has a structure in which an organic layer 111 of an R device, an organic layer 121 of a G device, and an organic layer 131 of a B device are formed in each sub-pixel, and has a metal semi-transparent electrode.

Example 4

In this example, in a full-color organic light-emitting apparatus of a structure illustrated in FIG. 13, the periodic structure formed in the device separation layer 104 is a tetragonal lattice illustrated in FIG. 16. The process for the formation of layers up to and including the reflective electrode are the same as that of Example 1.

Further, a device separation layer 104 of SiNxOy (silicon oxynitride) is formed to have a thickness of 175 nm, and thereafter, each sub-pixel is subjected to etching to form the emission region 302 and the periodic structure 310 (320, 330) of a tetragonal lattice as illustrated in FIG. 16, whereby an anode substrate with a photonic crystal structure is produced.

Here, the emission region 302 is formed so as to have a 50 μm square shape. In the tetragonal lattice, the period (arrangement) of the periodic structure 310 (320, 330) is identical in vertical and horizontal directions of each sub-pixel. Therefore, in the case where the light-emitting apparatus is visually observed, the same optical characteristics can be obtained in the vertical and horizontal directions, whereby the visibility can be improved. Conversely, the emission region 302 may have a square lattice structure having different periods in vertical and horizontal directions. In this case, the visibility can be adjusted depending on the direction.

In this example, the R periodic structure 310 has a period of 310 nm, an etching shape which is a 220 nm square, and an etching depth of 40 nm. The G periodic structure 320 has a period of 270 nm, an etching shape which is a 190 nm square, and an etching depth of 90 nm. The B periodic structure 330 has a period of 230 nm, an etching shape which is a 150 nm square, and an etching depth of 115 nm. That is, the period of the periodic structure is the longest in the R device and is the shortest in the B device.

The anode substrate thus produced is ultrasonically cleaned with isopropyl alcohol (IPA), and washed with boiled water, followed by drying. After that, the resultant is cleaned with UV/ozone, and organic layers 111, 121, and 131 of the R device, the G device, and the B device are formed by vacuum vapor deposition, respectively.

First, Compound (I) above is vacuum vapor deposited in a thickness of 25 nm as a hole-transporting layer of the R device, in a thickness of 25 nm as a hole-transporting layer of the G device, and in a thickness of 20 nm as a hole-transporting layer of the B device, respectively, in each sub-pixel, using a shadow mask. The vacuum degree at this time is $1 \times 10^{-4}$ Pa, and the vapor deposition rate is 0.2 nm/sec.

Next, an emission layer of each of the R device, the G device, and the B device is formed using a shadow mask. As the emission layer of the R device, CBP as a host and Btp2Ir (acac) as a phosphorescent compound are co-deposited to form an emission layer with a thickness of 50 nm. As the emission layer of the G device, Alq3 as a host and coumarin 6 as a light-emitting compound are co-deposited to form an emission layer with a thickness of 30 nm. As the emission layer of the B device, Compound (II) above as a host and Compound (III) above as a light-emitting compound are co-deposited to form an emission layer with a thickness of 20 nm. The vacuum degree during vapor deposition is $1 \times 10^{-4}$ Pa and the film formation speed is 0.2 nm/sec.

Further, as a common electron-transporting layer, a film of BPhen is formed in a thickness of 10 nm by vacuum vapor deposition for all of the devices of the three colors. The vacuum degree during vapor deposition is $1 \times 10^{-4}$ Pa, and the film formation speed is 0.2 nm/sec.

Further, a co-deposited film of BPhen and $Cs_2CO_3$ (weight ratio is 90:10) is formed in each sub-pixel in such a manner that an electron injection layer of the R device is formed in a thickness of 60 nm, an electron injection layer of the G device is formed in a thickness of 30 nm, and an electron injection layer of the B device is formed in a thickness of 20 nm, using a shadow mask. The vacuum degree during vapor deposition is $3 \times 10^{-4}$ Pa and the film formation speed is 0.2 nm/sec. The process for the formation of the transparent electrode 103 and the subsequent layers are the same as that in Example 1.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2007-030476, filed Feb. 9, 2007, 2007-187796 filed Jul. 19, 2007 and 2008-011088 filed Jan. 22, 2008 which are hereby incorporated by reference herein in their entirety.

What is claimed is:

1. A light-emitting apparatus comprising:
   a substrate; and
   a light-emitting device formed on the substrate, the light-emitting device comprising:
   a first electrode formed on the substrate;
   an insulating member covering a periphery of the first electrode;
   a functional layer formed on an exposed portion of the first electrode and comprising an emission layer; and
   a second electrode formed on the functional layer and the insulating member,
   wherein a periodic structure is formed on a surface of the insulating member opposite to a substrate side, and an optical waveguide is formed in the insulating member.

2. The light-emitting apparatus according to claim 1, wherein a period a of the periodic structure satisfies $$\frac{1}{n+n_{ex}}\lambda < a$$

with respect to a refractive index n of the emission layer, a refractive index $n_{ex}$ of a light extraction side medium, and a peak wavelength $\lambda$ of a spectrum of light extracted outside via the periodic structure.

3. The light-emitting apparatus according to claim 1, wherein a period of the periodic structure is larger than 0.25 times a peak wavelength of a spectrum of light extracted outside via the periodic structure.

4. The light-emitting apparatus according to claim 1, which comprises a light-emitting device for emitting light of red color, a light-emitting device for emitting light of green color, and a light-emitting device for emitting light of blue color, wherein a period of the periodic structure of the light-emitting device for emitting light of red color is the longest and a period of the periodic structure of the light-emitting device for emitting light of blue color is the shortest.

5. The light-emitting apparatus according to claim 1, wherein the light-emitting device is arranged in plurality in vertical and horizontal directions in an emission region, and the periodic structure of the light-emitting devices arranged in the vertical direction and the periodic structure of the light-emitting devices arranged in the horizontal direction have the same period.

6. The light-emitting apparatus according to claim 1, further comprising a black matrix on a light extraction side of the periodic structure, wherein a period a of the periodic structure satisfies the following equation:

$$\frac{\sqrt{m_1^2+m_2^2}}{n+n_{ex}}\lambda < a < \frac{\sqrt{m_1^2+m_2^2}}{n_{ex}}\lambda$$

with respect to integers $m_1$ and $m_2$, a refractive index n of the emission layer, a refractive index $n_{ex}$ of a light extraction side medium, and a peak wavelength $\lambda$ of a spectrum of light extracted outside via the periodic structure.

7. The light-emitting apparatus according to claim 1, further comprising a microcavity structure in a stack direction of the light-emitting device.

8. The light-emitting apparatus according to claim 1, further comprising a color filter for transmitting light emitted from the light-emitting device on a light extraction side of the light-emitting device.

9. The light-emitting apparatus according to claim 1, further comprising a circularly polarizing plate on the light extraction side of the light-emitting device.

10. The light-emitting apparatus according to claim 1, wherein the periodic structure has a structure in which a height of the optical waveguide varies continuously in an in-plane direction of the substrate.

11. The light-emitting apparatus according to claim 1, wherein a refractive index of the insulating member and a refractive index of the second electrode are equal to each other.

12. The light-emitting apparatus according to claim 1, wherein the light-emitting device is an OLED device.

13. The light-emitting apparatus according to claim 1, wherein the optical waveguide is formed in the insulating member and between a bottom portion of the periodic structure and the first electrode or between the bottom portion of the periodic structure and the substrate.

* * * * *